United States Patent [19]

Snelling

[11] Patent Number: 4,835,461
[45] Date of Patent: May 30, 1989

[54] MICRODEFLECTOR PROBE FOR ELECTROSTATIC VOLTMETER

[75] Inventor: Christopher Snelling, Penfield, N.Y.

[73] Assignee: Xerox Corporation, Stamford, Conn.

[21] Appl. No.: 600,060

[22] Filed: Apr. 13, 1984

[51] Int. Cl.⁴ .......................................... G01R 29/22
[52] U.S. Cl. .................... 324/109; 324/458; 324/457
[58] Field of Search ............. 324/457, 458, 157, 72.5, 324/96, 97; 350/6.5, 6.6, 487, 607

[56] References Cited

U.S. PATENT DOCUMENTS

| | | | |
|---|---|---|---|
| 2,794,955 | 6/1957 | Rich | 324/109 |
| 3,614,677 | 11/1971 | Wilfinger | 350/487 |
| 3,772,592 | 11/1973 | Rhodes | 324/458 |
| 3,997,839 | 12/1976 | Dreyfus et al. | 324/109 |
| 4,002,975 | 1/1977 | Erikson | 324/96 |
| 4,046,471 | 9/1977 | Branham | 355/3 R |
| 4,100,484 | 7/1978 | Buchceit | 324/32 |
| 4,197,493 | 4/1980 | Juve et al. | 324/72 |
| 4,339,721 | 7/1982 | Nihira | 324/457 |
| 4,350,988 | 9/1982 | Masegi | 350/6.6 |

FOREIGN PATENT DOCUMENTS

| | | | |
|---|---|---|---|
| 2409519 | 7/1979 | France | 324/109 |
| 159226 | 4/1963 | U.S.S.R. | 324/109 |
| 227447 | 2/1969 | U.S.S.R. | 324/109 |
| 0391986 | 6/1933 | United Kingdom | 324/458 |
| 497728 | 3/1937 | United Kingdom | 324/109 |
| 747509 | 4/1956 | United Kingdom | 324/109 |
| 1478670 | 7/1977 | United Kingdom | 324/457 |

OTHER PUBLICATIONS

Dynamic Micromechanics on Silicon: Techniques & Devices, K. E. Petersen, IEEE Trans. on Electron Devices, vol. ED-25, No. 10, Oct. 1978, pp. 1241-1250.
The Mirror-Matrix Tube: A Novel Light Valve for Projection Displays, R. N. Thomas et al., Proceeding of the S.I.D., vol. 16/3, Third Quarter 1975, pp. 184-194.
DC Electrostatic Voltmeters and Fieldmeters, R. E. Vosteen, ES-WED-AM1, pp. 799-810, Oct. 1974.

Primary Examiner—Reinhard J. Eisenzopf
Assistant Examiner—Jose M. Solis
Attorney, Agent, or Firm—Frederick E. McMullen

[57] ABSTRACT

An electrostatic voltmeter with probe for measuring the charge on a surface, the probe comprising a microdeflector unit having a base; a flexible finger supported on the base in cantilever fashion, the finger deflecting in response to a potential difference thereacross; means to bias the base to a predetermined potential; a sensing electrode on the finger having a side positionable in spaced relation to the surface, the capacitive relation established creating a charge representative of the charge on the surface on the sensing electrode causing deflection of the finger; means to impinge a beam of light on the finger; and a detector disposed to detect reflection of the beam by the finger on predetermined deflection of the finger corresponding to a preset charge measured on the surface. In a second embodiment, a feed-back loop is provided; in a third embodiment, the finger is vibrated to render the probe spacing insensitive; and in a forth embodiment the microdeflector unit is modified to function as the image reading device in a multi-code copier/printer application.

12 Claims, 3 Drawing Sheets

MICRODEFLECTOR PROBE FOR ELECTROSTATIC VOLTMETER

The invention relates to a microdeflector based probe for detecting charges on a surface, and more particularly, to an improved electrostatic voltmeter incorporating the aforementioned probe, and further, to an improved multi-function copier/printer employing the aforementioned probe as an image reader.

Electrostatic voltmeters are utilized to measure charge on a surface, as for example the photoconductive surface of a xerographic system. There, it is often desirable to determine the charge on the photoconductive surface at one or more locations in the xerographic process to determine the operating condition of the system, and the need to adjust, service or replace system components. Indeed, in some xerographic system applications, an electrostatic voltmeter is incorporated into and made an integral part of the system with a feed back loop employed to enable automatic resetting of one or more of the system process components in accordance with the charge conditions detected by the electrostatic voltmeter.

As will be understood, electrostatic type voltmeters are desirable in that no physical contact with the surface whose charge is being measured is required. In applications such as the xerographic system alluded to above, this is important in preventing damage or scratching of the relatively delicate photoreceptor surface. The electrostatic voltmeter probe, which is spaced opposite the surface whose charge is to be measured and out of contact therewith, operates on the basis of a capacitive relation established with the surface whose charge is being measured, the surface itself forming in effect one plate of a capacitor with the probe sensing electrode the second plate. Circuitry is provided to translate the charge accumulated on the probe electrode to a signal representing the charge detected.

The invention provides to an electrostatic voltmeter for measuring charges on a surface which comprises in combination: a probe having a microdeflector sensing unit, the sensing unit comprising a base, a flexible finger spacedly overlaying the base so that a portion of the finger can deflect relative to the base on imposition of a potential thereacross, a sensing electrode on the finger and movable with the finger on deflection of the finger, the sensing electrode including a side adapted to be spaced opposite and in capacitive relationship to the surface so that a charge representative of the charge on the surface is produced on the sensing electrode to cause deflecting movement of the finger relative to the base; and means for converting deflection of the finger to a signal representing the charge on the surface.

IN THE DRAWINGS

Figure 1:
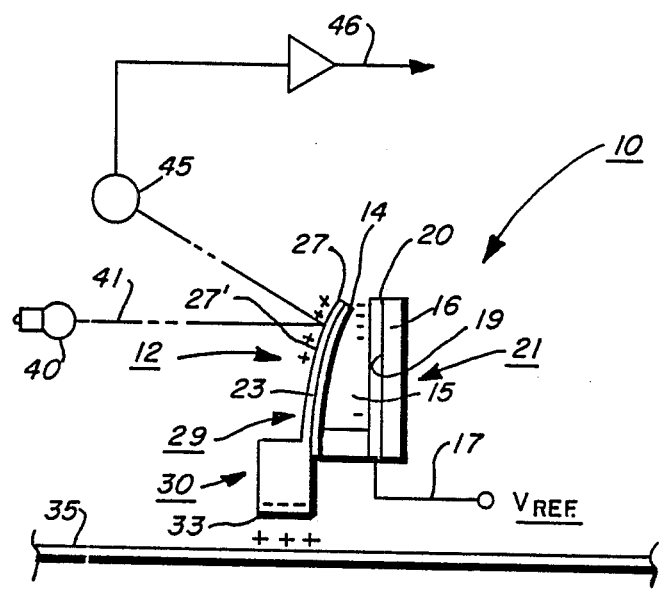
FIG. 1 is a schematic view of an electrostatic voltmeter incorporating the microdeflector probe of the present invention.

Referring to FIG. 1 of the drawings, an electrostatic voltmeter or ESV, designated generally by the numeral 10, and incorporating the microdeflector probe 12 of the present invention, is there shown. As will be understood by those skilled in the art, ESV's are typically employed to sense the charge level on the photoconductor surface, designated by the numeral 35 herein, of a xerographic type copier or printing machine (not shown). In such copiers or printing machines, the photoconductive surface 35 is uniformly charged to a predetermined level by suitable charging means such as a corotron, and thereafter exposed to the original being copied. The latent electrostatic image created on the photoconductive surface is thereafter developed and the developed image transferred to a copy sheet and fixed. The photoconductive surface 35 is cleaned and charged again to repeat the process.

In copiers or printing machines, it is often desirable or necessary to determine the charge on the photoconductive surface 35 at some point or points during the xerographic process, and for this purpose, the probe of an ESV is placed in predetermined operational relation to the photoconductive surface 35. The charge measured by the ESV may be indicated visually to the user or operator on a meter or scale, or may be input directly to the machine controller for use by the controller in setting or adjusting the operating level of one or more of the xerographic processing components, such as for example the charge corotron.

While the present invention is described in a copier or printing machine environment, the invention is not to be considered limited to these applications, but may be used in any application where the charge level on a surface is to be measured.

The probe 12 of ESV 10 employs a microdeflector in the form of a flexible finger 14 disposed in cantilever fashion opposite a recess 15 in a rigid base or chip 16. Preferably, base 16 is formed from silicon while flexible finger 14 comprises silicon dioxide. An electrode 20 may be provided on the surface 19 of recess 16 opposite finger 14, electrode 20 for example being formed by doping the surface 19 of recess 15 with boron. Alternately, electrode 20 may be dispensed with and the conductivity of base 16 alone relied upon. Base 16 (or electrode 20 where used) is coupled to a suitable reference potential (Vref) by line 17. As will appear, base 16 alone or in combination with electrode 20, forms what is hereinafter referred to as a reference electrode 21.

Microdeflector 13 may be formed by reacting one surface of a silcon chip with oxygen to form a silicon dioxide layer of desired depth. Selective etching may be used to remove the silicon material underlaying the silicon dioxide layer to provide recess 15 and delineate finger 14. An electrode 27, the outer surface 27' of which provides a mirror-like reflective surface, is provided on finger 14, electrode 27 preferably being formed by coating the outer surface 23 of finger 14 with a suitable metal such as Chromium and Gold. The lower portion of electrode 27 is enlarged at 30 to present a generally rectangular charge sensing or probe surface 33 disposable in charge sensing relation with the photoconductive surface 35 on use or installation of ESV 10. A probe surface 33 of 0.002 in. by 0.002 in. has been found to be satisfactory. Electrode 27 together with finger 14 forms what is hereinafter referred to as a flexible sensing electrode 29 in spaced overlaying relation with the aformentioned reference electrode 21.

Microdeflector 13 operates on an electrostatic deflection principle, a difference in voltage between reference electrode 21 and sensing electrode 29 creating an electrostatic force which causes the flexible sensing electrode 29 to bend or deflect toward reference electrode 21. Since the degree of bending or deflection that sensing electrode 29 undergoes is dependent upon the voltage differential between electrodes 21 and 29 and the voltage (Vref) on reference electrode 21 is known, the degree of bending or deflection of sensing electrode 29 is a measure of the voltage on electrode 29. Accordingly, the charge on photoconductive surface 35 is a function of the deflection of sensing electrode 29.

To provide a visible indication or readout of the charge on photoconductive surface 35, a suitable light source 40 such as a Light Emitting Diode or LED is provided. LED 40 is located so as to project a beam of light 41 onto the outer reflective surface 27' of sensing electrode 29 proximate the finger unsupported end. A suitable light detector 45, which may for example comprise a photodiode, is positioned to intercept light reflected by electrode 29 when electrode 29 undergoes a predetermined deflection. Preferably, LED 40 and detector 45 are disposed relative to electrode 29 so that detector 45 responds to full deflection of electrode 29. For example, when the charge potential on surface 35 (Vp/r) minus the reference voltage (Vref) is approximately 500 volts and the spacing between probe surface 33 and the photoconductive surface 35 is approximately 0.006 in., full deflection of electrode 29 (i.e. approximately 5°) will occur.

As will be understood, ESV 10, during use, is calibrated so that the deflection of sensing electrode 29 to which detector 45 responds represents a known charge level.

The signal output of detector 45 is fed to line 46 which may be coupled to a suitable visual display such as a meter when a visible reading is desired. Where ESV 10 is used as a component or input to the copier or machine controller, the signal in line 46 is fed to the controller which in turn responds to adjust or reset one or more of the machine processing components such as the charge corotron (not shown) for charging the photoconductive surface 35.

The embodiment shown in FIG. 1 employs a single light detector 45. Where the reference voltage (Vref) is fixed, this arrangement may be used to detect when the charge on photoconductive surface 35 (Vp/r) minus the potential to which reference electrode 21 is biased (Vref.) is greater than a predetermined threshold potential (Vthres.), the latter being determined by the physical location of detector 45. In this case, the threshold level (Vthres.) is determined by the mechanical and electrical parameters of the probe. While for some applications such as image reading or assurance of minimum charging conditions, detection in relaation to a threshold may suffice, in other applications it may be desirable to provide an output indicative of the actual magnitude of the charge on photoconductive surface 35 (Vp/r).

Figure 2:
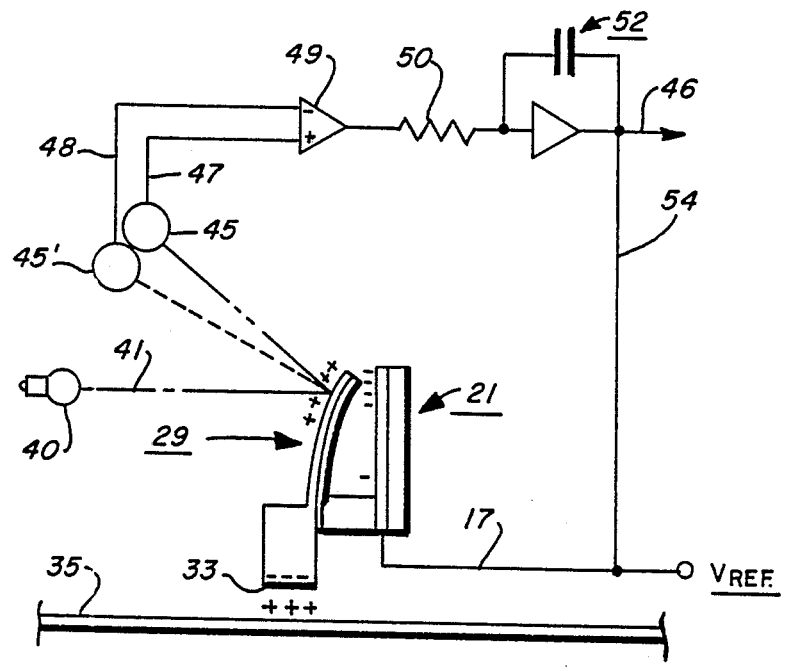
FIG. 2 is a view showing a second embodiment of the microdeflector probe of the present invention in which a feed back loop is provided.

In the embodiment shown in FIG. 2, where like numbers refer to like parts, a feed back system for this purpose is shown. There, a second detector 45' is disposed at a predetermined location along the arcuate path followed by light reflected from sensing electrode 29 as electrode 29 undergoes a change in deflection.

The outputs of detectors 45, 45' are coupled by lines 47, 48 to the + and − inputs of a suitable differential amplifier 49. The output of amplifier 49, which represents the difference between the signal inputs from detectors 45, 45' to the + and − inputs thereof, is fed through a suitable resistor 50 to signal integrating circuit 52. Circuit 52 integrates the signal output of amplifier 49 with the reference voltage (Vref) to provide an adjusted reference voltage input to reference electrode 21 and a signal output to line 46.

In operation of the FIG. 2 embodiment, it is presumed that the current charge on the photoconductive surface 35 causes sensing electrode 29 to deflect to a null position where light reflected therefrom falls between detectors 45 and 45'. So long as surface 35 remains at that charge (or within a predetermined range as determined by the operating tolerance of ESV 10), no signal is output by detector 45 or 45'. Should the charge on photoconductive surface 35 undergo a predetermined change, which may be represented by either an increase or decrease in charge potential with corresponding increase or decrease in electrode deflection, light reflected from the surface 37' of sensing electrode 29 will impinge on the appropriate detector 45 or 45'. Amplifier 49 responds to the signal from the responding detector 45 or 45' to output a signal which is integrated by circuit 52 with the reference voltage (Vref) to provide an adjusted reference voltage to reference electrode 21 to restore sensing electrode 29 to the null position. Concurrently, the changed reference voltage is output through line 46 to a suitable meter (not shown) to provide a visual readout of the charge measured on the photoconductive surface 35.

Alternately, the signal in line 46 may be input to the machine controller for use in adjusting one or more of the machine xerographic processing components.

While a detector pair 45, 45' has been shown, it will be understood that additional detectors may be provided at suitable locations along the path of light reflections from sensing electrode 29. In that event, the output circuit arrangement shown for detectors 45, 45' would be suitably modified to accommodate the added inputs. Alternately, detectors 45, 45' may be dispensed with and a single detector having spaced light sensing elements such as a Charge Coupled Device (CCD) used instead.

Figure 3:
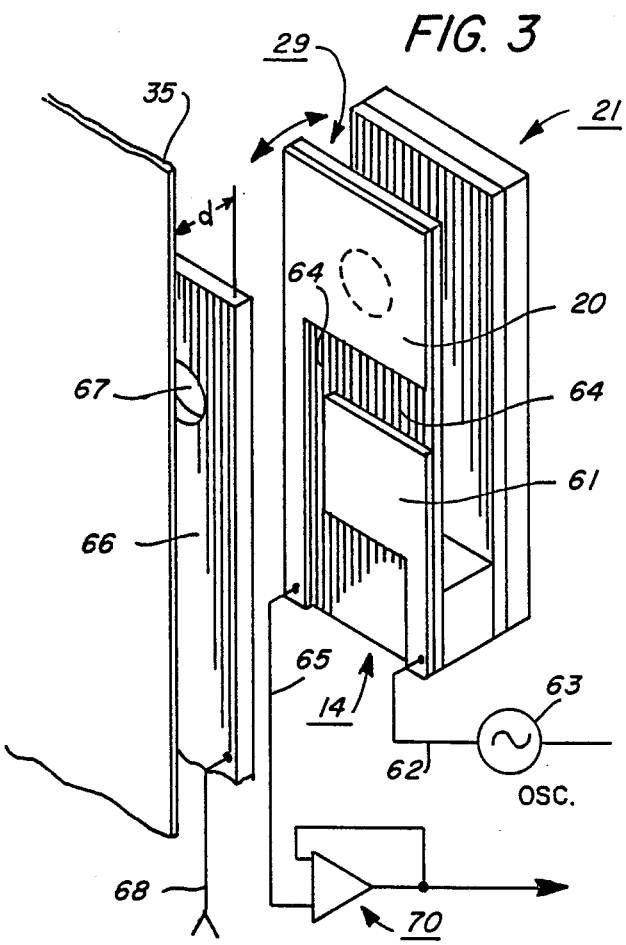
FIG. 3 is an isometric view of a modified sensing electrode for use with the microdeflector probe of the present invention to enable the probe to be spacing insensitive.
Figure 4:
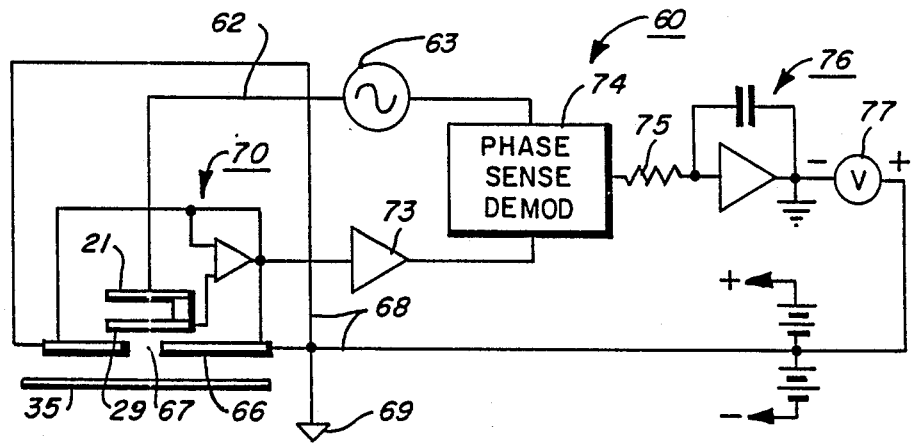
FIG. 4 is a logic diagram of an electrostatic voltage follower circuit for operating the probe shown in FIG. 3.

As understood, the distance at which the probe charge sensing surface 33 is spaced from the photoconductive surface 35 is determinative of the capacitive coupling between probe 12 nd photoconductive surface 35. For applications in which spacing independence is desired, probe 12 may be modified as shown in FIGS. 3 and 4 to provide a modulated sensitive electrode. In this arrangement, the ability of sensing electrode 29 to physically respond to electrostatic forces is taken advantage of to provide the desired mechanical vibratory movement of electrode 29.

Referring to FIGS. 3 and 4, where like numbers refer to like parts, sensing electrode 29 is modified by providing a second electrode 61 on finger 14 electrically isolated from electrode 20 by border area 64. Second electrode 61 is connected by line 62 to the output of oscillator 63 of voltage follower circuit 60 while the first electrode 20 is connected by line 65 to the pre-amplifier section 70 of circuit 60. The signal output of oscillator 63 to second electrode 61 causes sensing electrode 29 to oscillate, i.e. deflect toward and away from the photoconductive surface 35 in synchronization with the frequency of the oscillator signal.

A conductive ground plane member or bottom plate 66 having a sensitive aperture 67 is disposed opposite to and in predetermined spaced relation to photoconductive surface 35. Plate 66 is connected by line 68 to the circuit common 69 while the output of pre-amplifier section 70 is coupled to amplifier 73. The output of amplifier 73 is coupled to one input of phase sensitive demodulator 74 with the other input of demodulator 74 coupled to the output of oscillator 63. The output of demodulator 74 is passed through resistor 75 to integrator 76 having an output coupled to ground. A suitable meter 77 is connected across the output of integrator 76 and circuit common 69.

Where for example the charge on photoconductive surface 35 is at some positive potential, an a.c. signal, which varies inversely as the separation between sensing electrode 29 and the photoconductive surface 35 changes and which is proportional to the difference in d.c. potential between surface 35 and circuit common 69, is output by preamplifier section 70, amplified by amplifier 73, and input to demodulator 74. Demodulator 74 develops a positive d.c. voltage proportional to the in-phase component of the amplifier output which is fed to integrator 76 causing the output (i.e. ground) to go negative relative to circuit common 69. Accordingly, circuit common 69 and plate 66 are driven positive with respect to ground.

Driving plate 66 positive reduces the signal output of preamplifier section 70 and this process continues until the output of preamplifier section 70 goes to zero corresponding to a zero voltage difference between circuit common 69 and surface 35. As in the FIG. 2 embodiment, the change in potential to circuit common 69 may be read on meter 77.

While a separate driving electrode, i.e. electrode 61, is used to impart oscillation to sensing electrode 29, a vibration source such as a piezo electric transducer, may instead be mechanically coupled to the sensing electrode 29 for this purpose. In this type of arrangement, the vibration source would desirably be at or near the natural resonant frequency of the flexible sensing electrode.

Figure 5:
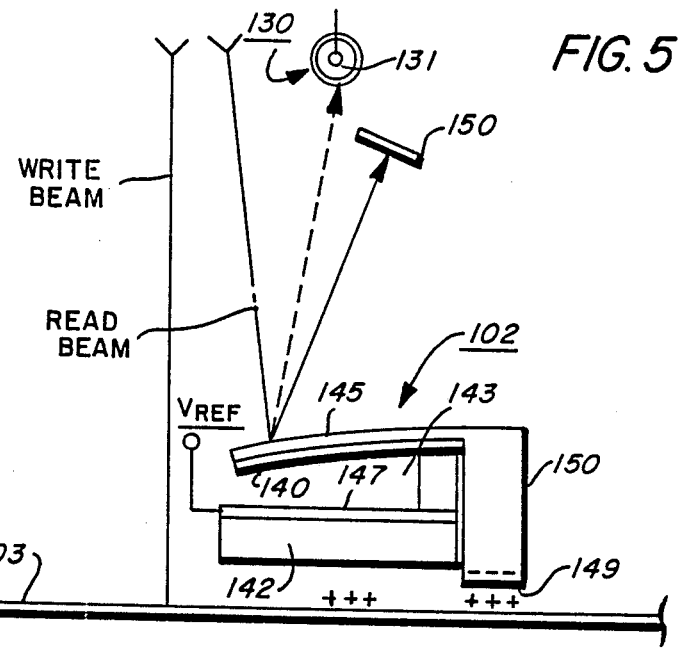
FIG. 5 is a view showing details of the microdeflector probe modified for use as an image scanner.
Figure 6:
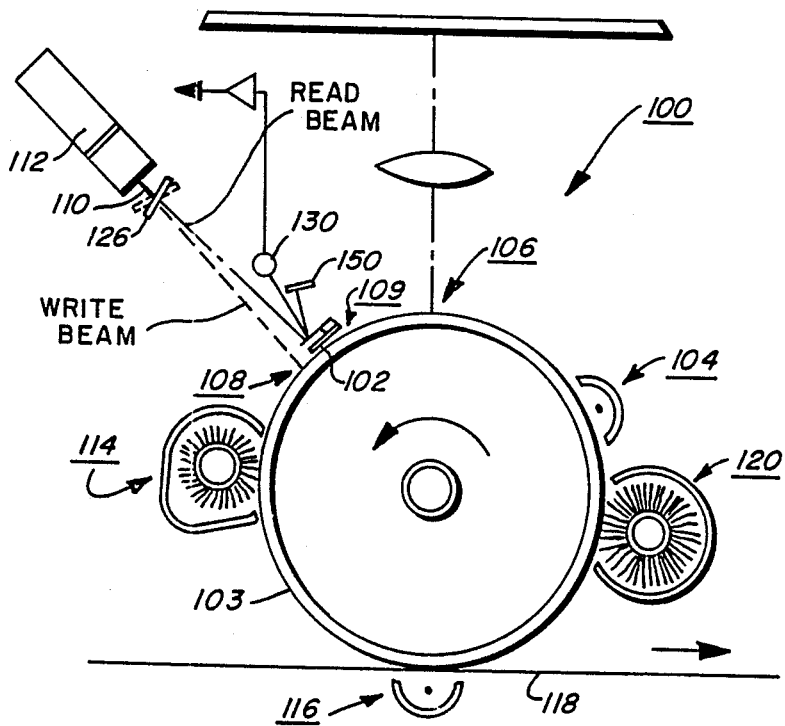
FIG. 6 is a schematic view of an electrostatic copier/printer incorporating the microdeflector probe shown in FIG. 5.

Referring to FIGS. 5 and 6 of the drawings, there is shown a xerographic type multi-function copier/printer, designated generally by the number 100, which is operative in a COPY mode to produce copies of a document original, in a WRITE mode to write images on the photoconductive surface of the copier/printer photoreceptor in accordance with an image signal input, and in a READ mode to convert the latent electrostatic image on the photoreceptor to image signals. For operation in the READ mode, copier/printer 100 utilizes a microdeflector array 102 to detect or read the latent electrostatic image charge pattern on the copier/printer photoreceptor and convert the image charge pattern to image signals representative of the image, the microdeflector array 102 being similar in construction and operating principle to the heretofore described microdeflector ESV probe.

Copier/printer 100 includes a photoreceptor 103 shown here in the form of a drum. Other photoreceptor configurations such as belt or web may however be envisioned. A charge station 104 is provided where photoreceptor 103 is charged in preparation for imaging. For operation in the COPY mode, a light/lens exposure station 106 is provided downstream of charge station 104. There, the charged photoreceptor 103 is exposed to a light image of the document original (not shown) being copied.

For operation in the WRITE mode, a write station 108 is provided downstream of exposure station 106 where photoreceptor 102 is raster scanned by a beam 110 of high intensity electro-magnetic radiation derived for example from laser 112. Beam 110 is modulated by suitable means (not shown) in accordance with an image signal input, the modulated beam exposing the photoconductive surface of photoreceptor 103 to create the latent electrostatic image represented by the image signal input. For operation in the READ mode, a read station 109 is provided adjacent write station 108. There, the latent electrostatic image on the photoconductive surface of photoreceptor 103 is read by array 102 and converted to image signals as will appear.

A developer station 114 is provided downstream of read station 109 where the latent image created on photoreceptor 103 is developed followed by a transfer station 116 where the previously developed image is transferred to a copy sheet 118. Residual developer materials are removed from photoreceptor 103 at cleaning station 120 prior to charging at charge station 104.

Suitable means such as a polygon (not shown) are provided for scanning or sweeping beam 110 across photoreceptor 103, there being suitable optical elements such as a lens (not shown) for focusing beam 110 on photoreceptor 103 at write station 108. To enable selected operation in either the READ or WRITE mode, an optical deflector 126 is provided in the path of beam 110, deflector 126 when moved to the dotted line position shown in FIG. 6 directing beam 110 along a path to impinge on photoreceptor 103 at write station 108. When in the solid line position shown, optical deflector 126 directs the beam onto array 102 at read station 109. A tube like collector 130 is provided adjacent photoreceptor 103 to collect or capture light reflected from array 102 as will appear. A suitable light detector 131 in collector 130 converts light rays captured by collector 130 into electrical signals representative of the latent electrostatic image scanned.

Microdeflector array 102 comprises an array of discrete flexible fingers 140 disposed in side by side fashion on an elongated base 142, the longitudinal axis of base 142 extending in a direction substantially perpendicular to the direction of movement of photoreceptor 103. To accommodate deflection of fingers 140, an elongated recess 143 is formed in base 142 under the free end of fingers 140. As described earlier, base 142 is preferably silicon with fingers 140 silicon dioxide, the array of fingers 140 and recess 143 being formed on base 142 as by selective etching.

Each flexible finger 140 has a conductive sensing electrode 145 thereon, electrodes 145 being electrically isolated from one another. Electrodes 145, which comprise any suitable metal or metal combination such as Chromium and Gold, are formed on the outer surface of fingers 140 by any suitable process. Sensing electrodes 145 have a right angle shape when viewed in cross-section, with a charge sensing surface 149 provided on the depending leg 150 thereof. On installation of microdeflector array 102, the charge sensing surfaces 149 of electrodes 145 are disposed facing the surface of photoreceptor 103 and in predetermined spaced capacitive relation thereto. The portion of base 142 opposite flexible fingers 140 may be provided with a conductive reference electrode 147 thereon, or alternately, electrode 147 may be dispensed with and the conductivity of base 142 relied upon instead. The overall width of the array of sensing electrodes 145 is preferably at least equal to the width of the photoconductive surface to be scanned.

During operation of copier/printer 100 in the READ mode, as the latent electrostatic image on photoreceptor 103, which may be created by operation of copier/printer 100 in either the COPY or WRITE mode, passes opposite microdeflector array 102, a charge representative of the image charge on the photoconductive surface of photoreceptor 103 is induced on the sensing electrodes 145 opposite thereto. As described earlier, where the charge differential between the sensing electrode 145 and reference electrode 147 undergoes a change, the degree of deflection of the affected sensing electrode 145 changes proportionally.

As each line of the latent electrostatic image on photoreceptor 103 passes under microdeflector array 102, the individual sensing electrodes 145 of the array assume various degrees of deflection depending upon the charge on the photoreceptor surface portion opposite the electrode charge sensing surface 149. Concurrently, beam 110 raster scans across the array of sensing electrodes, and light is reflected by the individual electrodes 145 in directions according to the degree of electrode deflection at that time. Collector 130 is disposed to intercept and collect light reflected by electrodes 145 having a predetermined deflection representative of a predetermined image charge level on the photoconductive surface of photoreceptor 103. Detector 131 of collector 130 converts the collected light pulses to electrical signals representative of one image charge level (i.e. "1"). Where no light is collected, the image signal output of detector 131 represents a second charge level (i.e. "0").

To distinguish successive image signals from one another, suitable clock means (not shown) are provided for periodically enabling detector 131 in synchronism with the scanning of beam 110 across the array of sensing electrodes.

To protect against exposure to any spurious reflections of the high intensity scanning beam 110 during operation in the READ mode, a suitable light absorbing stop 150 is preferably provided to intercept light reflected from microdeflector array 102 at angles other than that which impinges on collector 130.

While the invention has been described with reference to the structure disclosed, it is not confined to the details set forth, but is intended to cover such modifications or changes as may come within the scope of the following claims.

What is claimed is:

1. In an electrostatic voltmeter for measuring charges on a surface, the combination of:
   (a) a probe having a micro-deflector sensing unit, said sensing unit comprising
      (1) a base;
      (2) a flexible finger on said base, a portion of said finger spacedly overlaying said base so that said finger portion can deflect toward and away from said base on imposition of a potential thereacross;
      (3) a sensing electrode on said finger and movable with said finger toward and away from said base on deflection of said finger, said sensing electrode including a side adapted to be spaced opposite and in capacitive relationship to said surface so that a charge representative of the charge on said surface is produced on said sensing electrode to cause deflecting movement of said finger relative to said base; and
   (b) means for converting deflection of said finger to a signal representing the charge on said surface.

2. The voltmeter according to claim 1 including a reference electrode on said base; and
   means to bias said reference electrode to a predetermined reference potential to pre-deflect said finger together with said sensing electrode and enhance sensitivity of said probe.

3. The voltmeter according to claim 1 in which said converting means includes
   means for impinging a beam of electro-magnetic radiation on said finger, said beam being reflected by said finger; and
   detector means for detecting the beam reflected by said finger, said beam being reflected onto said detector on deflection of said finger to a predetermined position whereby the signal output of said detector represents a predetermined charge on said surface.

4. The voltmeter according to claim 3 in which said detector means includes,
   at least two detectors for detecting said beam on deflection of said finger to different predetermined positions whereby the signal output of said detectors represent different predetermined charges on said surface.

5. The voltmeter according to claim 3 in which said detector means includes a first detector for detecting said beam on deflection of said finger to a first position whereby the signal output of said first detector represents a predetermined first charge on said surface, and
   a second detector for detecting said beam on deflection of said finger to a second position whereby the signal output of said second detector represents a predetermined second charge on said surface.

6. The voltmeter according to claim 1 including means to vibrate said finger whereby to make said sensing electrode relatively insensitive to the spatial relation between said sensing electrode and said surface.

7. The voltmeter according to claim 6 in which said vibrating means includes means to apply an oscillating reference potential to said base.

8. The voltmeter according to claim 7 in which said sensing electrode probe includes a scanning aperture.

9. In a multi-function copier/printer having a photoreceptor and selectively operable in a first copy mode to produce latent electrostatic images from originals on said photoreceptor, in a second write mode to scan a beam of light across said photoreceptor and modulate said beam in accordance with image signals to produce latent electrostatic images represented by said image signals on said photoreceptor, and in a third read mode to scan latent electrostatic images on said photoreceptor and convert said images to image signals, the improvement comprising:
   (a) support means;
   (b) a plurality of flexible charge gathering fingers arranged in a linear array on said support means, each of said fingers having an unsupported portion capable of deflecting relative to said support means in response to a charge potential thereon, disposition of said array of flexible fingers in capacitive relation with said photoreceptor and the latent electrostatic images thereon resulting in discrete deflections of said fingers individually in response to the image charge levels on said photoreceptor opposite said fingers;

(c) means for scanning said beam across said array of fingers;

(d) collecting means for capturing light reflected from those of said fingers having a predetermined deflection; and (e) means for converting light captured by said collecting means to image signals representative of said latent images on said photoreceptor.

10. The copier/printer according to claim 9 including a sensing electrode on each of said fingers, said sensing electrodes having a reflective surface to enhance reflection of said beam.

11. The copier/printer according to claim 9 including means to bias said support means to a predetermined reference potential whereby to uniformly pre-deflect said fingers.

12. The copier/printer according to claim 9 including means for selectively impinging said beam on said photoreceptor when in said second write mode or on said array of fingers when in said third read mode.

* * * * *